United States Patent
Kang et al.

(10) Patent No.: US 7,632,352 B2
(45) Date of Patent: Dec. 15, 2009

(54) SPIN-COATING APPARATUS AND COATED SUBSTRATES PREPARED USING THE SAME

(75) Inventors: Tae-sik Kang, Daejeon (KR); Seongkeun Lee, Daejeon (KR); Youngjun Hong, Daejeon (KR)

(73) Assignee: LG Chem, Ltd., Seoul (KR)

( * ) Notice: Subject to any disclaimer, the term of this patent is extended or adjusted under 35 U.S.C. 154(b) by 322 days.

(21) Appl. No.: 11/297,635

(22) Filed: Dec. 9, 2005

(65) Prior Publication Data
US 2007/0006804 A1  Jan. 11, 2007

(30) Foreign Application Priority Data
Dec. 10, 2004  (KR) .................. 10-2004-0104504

(51) Int. Cl.
B05C 11/02 (2006.01)
B05C 13/02 (2006.01)
H01L 29/12 (2006.01)

(52) U.S. Cl. .......... 118/52; 118/500; 118/503; 118/612; 118/320; 428/64.1; 428/64.6; 428/620

(58) Field of Classification Search .......... 118/52, 118/56, 319, 320, 728, 730, 500, 326, 503; 427/240, 407.1, 425, 162, 282; 396/627; 269/57; 451/285; 720/712, 715; 428/64.1, 428/64.6, 846.9, 620; 369/283; 264/1.33, 264/1.37
See application file for complete search history.

(56) References Cited

U.S. PATENT DOCUMENTS 6,527,860 B1 * 3/2003 Yoshihara et al. .......... 118/50
6,533,864 B1 * 3/2003 Matsuyama et al. .......... 118/704
6,540,869 B2 * 4/2003 Saeki et al. .......... 156/345.31
2005/0039675 A1  2/2005 Kang et al.

FOREIGN PATENT DOCUMENTS

| JP | 1993-103396 | 4/1993 |
| JP | 1996-316186 | 11/1996 |
| KR | 2001-0017145 | 3/2001 |
| KR | 2001-0055044 | 7/2001 |
| KR | 2003-0004541 | 1/2003 |
| KR | 2005-0023038 | 3/2005 |

* cited by examiner

*Primary Examiner*—Yewebdar T Tadesse
(74) *Attorney, Agent, or Firm*—McKenna Long & Aldridge LLP

(57) ABSTRACT

Provided is a spin coating apparatus having a ring-shaped or polygonal auxiliary member for use in manufacture of a coated substrate via spin coating, wherein the auxiliary member is positioned adjacent to the side of a substrate for coating, within a range of a spaced distance of 0.03 to 0.8 mm and a range of a height deviation of less than 0.1 mm, upon mounting the substrate.

When a surface of a substrate for coating is spin coated with a coating agent using the apparatus of the present invention, it is possible to eliminate or effectively reduce a ski-jump phenomenon at end portions of a coated substrate occurring when spin coating is performed, thereby resulting in uniform coating of a coating solution on the substrate, and it is also possible to effectively decrease contamination of the substrate for coating due to inflow or stay of the remaining coating agent.

10 Claims, 2 Drawing Sheets

SPIN-COATING APPARATUS AND COATED SUBSTRATES PREPARED USING THE SAME

This application claims the benefit of Korean Patent Application No. 10-2004-0104504 filed Dec. 10, 2004, in Korea, which is hereby incorporated by reference in its entirety.

FIELD OF THE INVENTION

The present invention relates to a spin coating apparatus. More specifically, the present invention relates to a spin coating apparatus having a ring-shaped or polygonal auxiliary member positioned within an appropriate range of a spaced distance and height deviation from a substrate for coating, so as to eliminate or reduce a "ski-jump (also referred to as a bump, a convex portion, an upheaval, a protrusion, a bead or the like)" phenomenon occurring at end portions of the substrate, upon spin-coating, while effectively performing a spin coating operation, and a coated substrate prepared using the same.

BACKGROUND OF THE INVENTION

FIG. 1 schematically illustrates an example in which a coating solution is spin-coated on a substrate for coating, using a conventional method. A conventional spin coating method is performed as follows. A liquid coating solution is dropped on the central portion of the substrate for coating which is rotating at a low speed, and then the substrate is rotated at a high speed. Then, the coating solution spreads outward from the center of the substrate due to the centrifugal force and is then applied to the entire substrate.

However, where a high-viscosity coating solution is applied to the substrate using a conventional spin coating method, viscoelasticity and surface tension of the coating solution result in a conglomeration portion of the coating solution at end portions of the substrate (see 20a of FIG. 1), which in turn, upon curing in such a state, forms a hill, thereby resulting in a ski-jump. Such a ski-jump leads to difficulty in formation of uniform coating throughout the entire substrate.

As the viscosity of the coating solution is higher, the ski-jump phenomenon is more pronounced. In manufacturing a variety of materials such as optical discs, semiconductor substrates, acoustic matching layers and the like, the high-viscosity coating solution is usually spin-coated on the substrate, and it is impossible to obtain a uniformly coated film, due to such a ski-jump. Hereinafter, problems associated with the ski-jump, exhibited when preparing several conventional substrates for coating, will be described, although application of the present invention is not limited thereto and the present invention can be applied to any fields suffering from the ski-jump problems occurred in preparation processes to which spin coating is applied.

1. Optical Disc

Generally, optical discs are widely used as information-recording media for use with an optical pickup which records/reproduces information in a non-contact manner. With changes in their recording capacity from compact discs (CDs) with a recording capacity of 600 to 800 MB to digital versatile discs (DVDs) with a recording capacity of 4 to 10 GB, optical discs have been developed toward improvement in a degree of integration of data. Recently, in order to offer high tone quality and high picture quality, a Blu-ray disc (BD) has been developed which is an optical disc having a recording capacity of more than 20 GB and using a blue laser to access the information. According to the System Description Blu-ray Disc Rewritable Format, a read-out area where information on the substrate is recorded is defined with a radius of up to 58.5 mm. Therefore, a data-recording area must secure a minimum radius of 58.5 mm, i.e. a diameter of up to 117 mm. For example, a 100 μm-thick cover layer should have a uniform thickness of 100±2 μm over a radius of 58.5 mm, and the remaining peripheral area of 1.5 mm should have a ski-jump of less than 10 μm in height. However, when a UV-curable resin layer is coated on the optical disc via the conventional spin coating method, a resin layer having a thickness of 100 μm exhibited a ski-jump of more than about 45 μm, which was very thick, thus failing to satisfy the above-mentioned specification.

In order to solve problems associated with the ski-jump, Korean Patent Publication Laid-open No. 2003-0004541 discloses a method of manufacturing for optical disc involving preparing a substrate having a larger diameter than an optical disc that will be finally completed, applying a UV-curable resin to the substrate, thereby forming a cover layer having a predetermined thickness, irradiating UV light to a bump lifted up at the peripheral portion of the cover layer so as to cure the resin and cutting the cured bump. However, this method requires an additional step to remove the bump in an optical disc production process, which in turn further increases manufacturing facility costs and manufacturing process time, thereby lowering manufacturing efficiency, and suffers from problems such as susceptibility to fragility, cracking and bending of the substrate upon cutting the bump.

Korean Patent Publication Laid-open No. 2001-0055044, as shown in FIG. 2, discloses a spin coating method of optical disc involving mounting a disc in a disc housing (see numerical reference 30 of FIG. 2) having the same inner diameter as an outer diameter of the disc and having the same depth of a disc-mounting groove as the thickness of the disc and spin coating UV-curable resin thereon. However, in this case, there are disadvantages such as difficulty to take the disc out of the disc housing after spin coating, contamination risk of a rear side of the disc due to inflow of the resin between the disc and disc housing and then along the side of the disc, and severe contamination of the optical disc due to accumulation of the coating solution in a jig upon repetitive coatings and difficulty to drain it. Further, although there is reduction in the size of the ski-jump, as compared to the conventional spin coating method, it is still difficult to obtain a uniform resin layer to the extent of a disc radius of 58.5 mm and there is a formation of the ski-jump of more than 20 μm thickness.

2. Integrated Circuit (IC)

In formation of an integrated circuit on a semiconductor wafer, in order to obtain any elements via selective implantation of impurities into a predetermined region on the semiconductor wafer or formation of a thin film layer thereon, a photolithography process using a photoresist film is usually employed. The photolithography process is carried out by coating the photoresist film to a thin thickness on the semiconductor wafer, exposing the coated photoresist film using a mask and developing it. This is followed by implantation of impurities through an opening of the photoresist film, or removing the photoresist film after formation of a thin film layer. Formation of the photoresist film is usually carried out using a spin coating method including applying a predetermined amount of a photoresist to the central part of the top surface of the semiconductor wafer and rotating the semiconductor wafer, thereby forming a film of the applied photoresist to a uniform thickness on the entire upper surface of the semiconductor wafer. In this case, upon implantation of impurities or formation of the thin film layer, it is not easy to form a photoresist film to a thick thickness of several tens of μm. This is because the photoresist itself, forming the photoresist film, has a predetermined viscosity and therefore a thick photoresist film is formed at edges of the semiconductor wafer upon performing spin coating. In fact, when the photoresist film having a thickness of 60 μm is coated on the semiconductor wafer via spin coating, the ski-jump having a width of about 7 mm and a thickness of 120 μm is occurred inward from edges of the semiconductor wafer.

In order to overcome these problems, Korean Patent Publication Laid-open No. 2001-0017145 discloses a method for forming thick photoresist film involving forming a first photoresist film on the top surface of the semiconductor wafer to a thickness ½ times that of photoresist film to be formed, via coating and soft curing processes, removing edge beads (ski-jump) of the first photoresist film formed at edge portions of the semiconductor wafer using a thinner, and finally forming a second photoresist film via coating and soft curing processes, thereby forming a photoresist film having a desired thickness. This method requires performing both a coating process and a curing process twice, thus leading to a complicated process and increased process time, and also presents a problem associated with additional costs for treatment of waste liquor generated due to use of the thinner to remove edge beads of the first photoresist film.

3. Multi-Layer Interconnection Circuit

Various kinds of integrated circuits (ICs) are used in many different electronic instruments such as computers. In addition, with a trend toward miniaturization and high performance of electronic instruments, there is a need for improvement in manufacturing reliability requiring high precision and high performance of circuits. As such, in order to increase a degree of integration of conventional semiconductor ICs, a multi-layer interconnection circuit, as shown in FIG. 3, is employed. Briefly describing a manufacturing process of such a semiconductor substrate, a first insulating film 32 and an oxide film are formed on a substrate 31 such as silicon, and a first interconnection layer 33 made up of an aluminum film or the like is formed on the surface of the first insulating film 32. Next, an interlayer dielectric (ILD) 34 such as a silica film or a silicon nitride film is applied thereon via chemical vapor deposition (CVD) or plasma enhanced chemical vapor deposition (PECVD). For planarization, a silica insulating film (a planarization film) 35 is formed on the interlayer dielectric (ILD) 34, and if necessary, a second insulating film 36 is then formed thereon. Next, a second insulating layer (not shown) is formed and if necessary, a second interconnection layer, interlayer dielectric, planarization film and insulating film may be formed. Such a multi-layer interconnection structure is used as a highly integrated circuit.

Examples of a method for forming the interlayer dielectric (ILD) include the following methods: 1) a method of forming a $SiO_2$ film on the surface of the substrate via chemical vapor deposition (CVD) using chemical gas such as $SiH_4$, 2) a method of forming a $SiO_2$ film via plasma-deposition of tetraethoxysilane (TEOS), and 3) a method of forming a $SiO_2$ film by applying a coating solution for formation of a silane-based insulating film, which is a coating solution for formation of a siloxane-based insulating film, to the surface of the substrate, via spin coating. Among these methods, the third method for forming the interlayer dielectric is preferred as a method having high processing capability and capability to form a planar film. However, upon spin coating the coating solution, it is disadvantageous in that convex portions (ski-jump), as shown in FIG. 1, are formed at a periphery of a silicon wafer. Thus, the periphery of the silicon wafer contacts with other structural elements and are contaminated, or when conveying the silicon wafer, convex portions at end parts around the insulating film contact with other devices, thereby creating cracks. When cranks occur, a large amount of foreign materials occur, thereby significantly decreasing productivity.

In order to solve such problems, Japanese Patent Publication Laid-open No. 1996-316186 discloses a method involving cleaning and removing convex portions formed around the silicon wafer by discharging a solvent downward onto the convex portions after spin coating. In this method, different cleaning solvents should be used depending upon kinds of an insulating film-forming coating solution (kinds, concentration and solvents of insulating components), and additional bumps (protrusions) may be formed during cleaning and removing processes. Such bumps may be a cause of foreign material such as convex portions.

4. Ultrasonic Transducer

An ultrasonic endoscope provides an ultrasonic tomogram by scanning oscillating ultrasonic beams, generated from an ultrasonic transducer, along a predetermined path, receiving again ultrasonic waves reflected from inner walls of the internal organs and pathogenic lesions through the ultrasonic transducer and preparing an image based on the thus obtained information. The ultrasonic transducer is generally composed of piezoelectric ceramics. There is a large difference in acoustic impedance between the piezoelectric ceramics and living body and therefore reflection and loss of ultrasonic waves are occurred at interface therebetween. In order to absorb such a difference and decrease acoustic loss, an acoustic matching layer is installed at an acoustic emission side of the piezoelectric ceramics. Since the ultrasonic transducer for the ultrasonic endoscope has an oscillation frequency ranging from several MHz to several tens of MHZ, the acoustic matching layer, which generally has a thickness ¼ times that of an ultrasonic wavelength, is fabricated to have a thickness of several tens of μm such that the speed of sound in a conventional resin is 2500 to 3000 m/s. When the acoustic matching layer is formed by the spin coating method, the viscosity of the resin should be significantly high and thus thickness-unstable portions (ski-jump) are occurred around the acoustic matching layer.

In order to solve such problems, Japanese Patent Publication Laid-open No. 1993-103396 proposes a method of manufacturing an acoustic matching layer involving dropping a UV-curable resin on a substrate, rotating the substrate to diffuse the UV-curable resins irradiating UV light to cure the resin under steady state at which centrifugal force exerted by rotation of the substrate and physical properties such as viscosity and surface tension of the resin are equilibrated, and cutting and removing the thickness-unstable portions. In this method, as UV light is irradiated from a spin coater, the UV-curable resin remaining on the spin coater is simultaneously cured, thus making it difficult to remove the remaining resin, and an additional step to cut the thickness-unstable portions is necessary, thus resulting in decreased productivity.

As such, a spin coating technique is widely used in various fields, but suffers from fundamental problems associated with formation of a ski-jump. Therefore, there is a need for the development of a method capable of solving problems of the ski-jump without causing contamination of the substrate or decreasing working efficiency during a manufacturing process of substrates for coating.

SUMMARY OF THE INVENTION

Therefore, the present invention has been made to solve the above problems, and other technical problems that have yet to be resolved.

As a result of a variety of extensive and intensive studies and experiments to solve the problems as described above, the inventors of the present invention have discovered, as will be described hereinafter, that, in a spin coating apparatus including a ring-shaped or polygonal auxiliary member, upon mounting a substrate for coating, when spin coating was performed under the condition at which a spaced distance between the inner upper end of the auxiliary member adjacent to the side of substrate and the periphery of the substrate is in a range of 0.03 to 0.8 mm, and a height deviation therebetween is within 0.1 mm, it is possible to prevent or minimize occurrence of a ski-jump at end portions of the substrate, while effectively performing spin coating, and have developed a spin coating apparatus having a particular structure for such a purpose. The present invention has been completed based on these findings.

Specifically, it is an object of the present invention to provide a spin coating apparatus capable of reducing the ski-jump while effectively performing a spin coating operation, when preparing a coated substrate via spin coating.

It is another object of the present invention to provide a coated substrate prepared using the above-mentioned spin coating apparatus.

In accordance with an aspect of the present invention, the above and other objects can be accomplished by the provision of a spin coating apparatus comprising a ring-shaped or polygonal auxiliary member wherein the member is installed adjacent to the side of a substrate for coating, upon mounting the substrate, a spaced distance between the inner upper end of the auxiliary member and the periphery of the substrate is within a range of 0.03 to 0.8 mm, and heights of the upper end of the auxiliary member and substrate are identical to each other or are positioned within a deviation range of less than 0.1 mm.

As used herein, the term "substrate for coating" refers to an uncoated plate-like substrate requiring a certain coating such as an optical disc, a semiconductor wafer and an ultrasonic endoscopic piezoelectric ceramic plate, and the term "coated substrate" refers to a substrate to which coating has been applied.

The ring-shaped or polygonal auxiliary member is a partial member of an apparatus having an internal surface shape corresponding to the peripheral shape of the substrate for coating, when the substrate for coating was mounted on the apparatus, and details thereof are disclosed in U.S. Patent Application Publication No. 2005-0039675, the disclosure of which is hereby incorporated by reference.

The present invention can further effectively perform prevention and removal of a ski-jump phenomenon by positioning a spaced distance between the inner upper end of the auxiliary member and the periphery of the substrate for coating, and a height of the upper end thereof within a specified range, and thus it is very important to adjust the spaced distance and height of the auxiliary member relative to the substrate for coating.

In order to further efficiently perform such height adjustment, mounting of the substrate for coating, removal of the ski-jump and recovery of the coated substrate, the spin coating apparatus preferably consists of a stationary part and a moving part, and the moving part is fabricated to have a height-adjustable structure such that the moving part is movable upward and downward relative to the stationary part. The stationary part and moving part are relative concepts. Therefore, where a turntable on which the substrate for coating is mounted moves upward and downward, the turntable is the moving part. By contrast, where the auxiliary member moves upward and downward, the turntable is the stationary part. A structure of the height-adjustable stationary and moving parts can be implemented in various structures. Although preferred examples of such structures will be described hereinafter, it should be understood that various other structures are possible and fall in the scope of the present invention.

A first exemplary structure is a structure in which threads are formed in a coupling region between the moving part and stationary part, and the height of the auxiliary member is adjusted by rotating the moving part.

A second exemplary structure is a structure in which the moving part and stationary part are coupled to each other via a height-adjusting screw, and the height of the auxiliary member is adjusted by rotating the screw. In this structure, in order to prevent rotation of the moving part and/or stationary part due to rotation of the screw, grooves may be formed in the moving part or stationary part, and sliding protrusions, which can be inserted into the grooves, may be formed in the corresponding stationary part or moving part.

A third exemplary structure is a structure in which male and female fastening members are included in a coupling region between the moving part and stationary part, and a height of the ring-shaped or polygonal auxiliary member is adjusted by inserting or releasing the male fastening member into or from the female fastening member.

Preferably, in order to achieve a stable coupling between the moving part and stationary part under the condition that the height is adjusted, a fixing screw may be further included in a coupling region between the moving part and stationary part.

In accordance with another aspect of the present invention, there is provided a coated substrate prepared by using the above-mentioned spin coating apparatus, wherein the coated substrate has a thickness deviation from the center thereof to the part immediately prior to the ski-jump region of less than ±2%, and has a ski-jump of less than 10% at end portions of the substrate.

In one preferred embodiment, the coated substrate may be an optical disc including a substrate and a cover layer, having a thickness deviation of less than ±2% in a data-recording region ranging from the center of the substrate to a radius of 58.5 mm and having a ski-jump of less than 10% at a peripheral portion thereof.

The spin coating apparatus in accordance with the present invention can be used to manufacture a write once read many (WORM) optical disc having a recording layer and an erasable optical disc, as well as a read only memory (ROM) optical disc for only reproducing the recorded information. In addition, the spin coating apparatus in accordance with the present invention can be used in any optical disc having a cover layer and a spacer layer, which are formed by spin coating, without a particular limit. Further, the spin coating apparatus in accordance with the present invention can be applied to a semiconductor manufacturing process involving spin coating of a high-viscosity solution as well as manufacturing of an acoustic matching layer for an ultrasonic transducer. The present invention is not limited to these applications and can thus be applied to any fields suffering from problems associated with the ski-jump in manufacturing processes to which spin coating is applied.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF PREFERRED EMBODIMENTS

Figure 1:
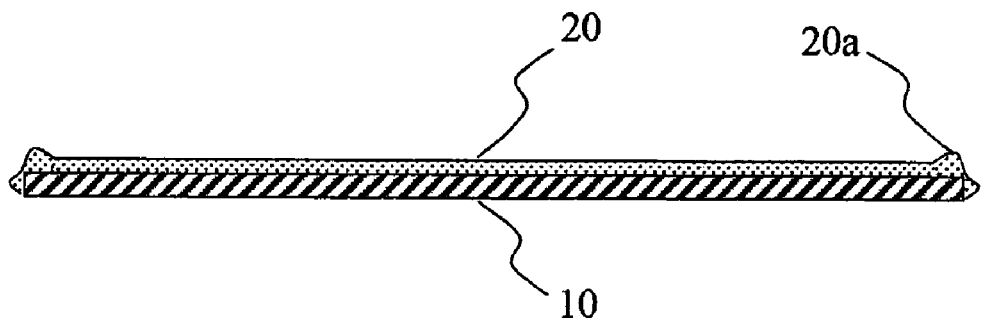
FIG. 1 schematically shows "ski-jump" phenomenon at end portions of a substrate, resulting from when spin-coated on a substrate for coating.
Figure 2:
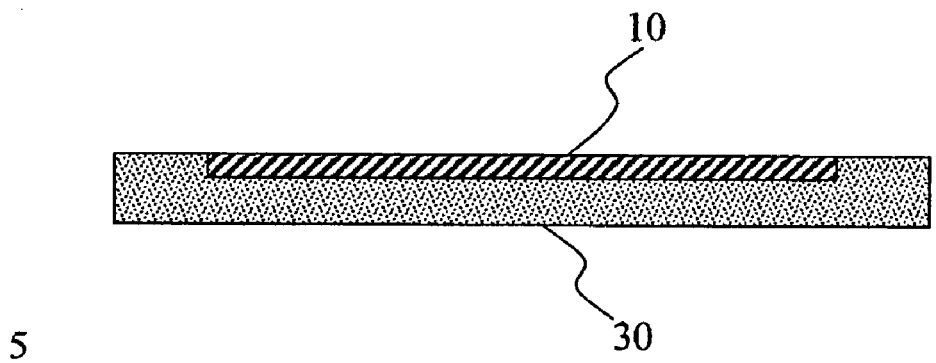
FIG. 2 schematically shows a disc housing which is a conventional spin coating apparatus for an optical disc.
Figure 3:
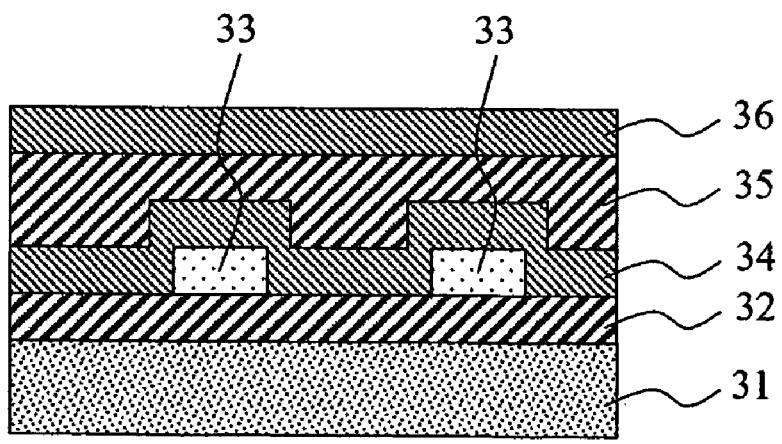
FIG. 3 schematically shows a cross-section of a semiconductor substrate.
Figure 4:
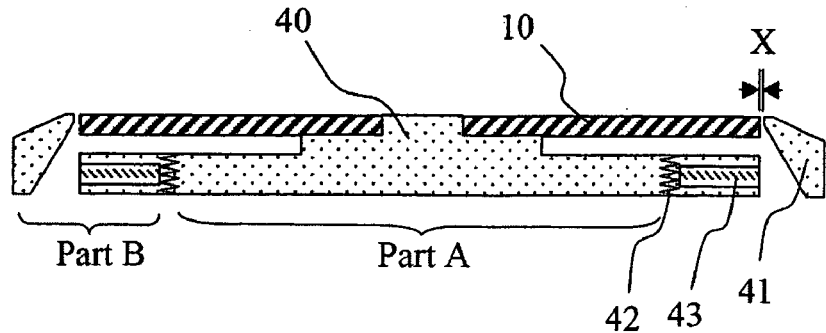
FIG. 4 schematically shows a spin coating apparatus in accordance with one embodiment of the present invention.

Hereinafter, the present invention will be described in more detail with reference to the accompanying drawings, but are not limited thereto. FIG. 4 shows one embodiment of a spin coating apparatus in accordance with the present invention.

Referring to FIG. 4, the spin coating apparatus in accordance with the present invention includes a turntable 40 on which a substrate for coating 10 can be mounted, and a ring-shaped or polygonal auxiliary member 41 positioned adjacent to the periphery of the substrate for coating 10 under the condition in which the substrate for coating 10 is mounted.

An inner upper end of the auxiliary member 41 and the periphery of the substrate for coating 10 are spaced from each other at a distance X of 0.03 to 0.8 mm, and more preferably 0.1 to 0.6 mm. Where the spaced distance X is less than 0.03 mm, it is difficult to mount or extract the substrate for coating 10 on or from the turntable 40, and upon extracting the coated substrate after coating a resin, the resin coated on the auxiliary member 41 affects formation of a ski-jump. Conversely, where the spaced distance X is not less than 0.8 mm, the auxiliary member 41 is excessively spaced from the substrate 10, and thus reducing effects of the ski-jump are insignificant as compared to when the auxiliary member 41 is not provided.

Figure 5:
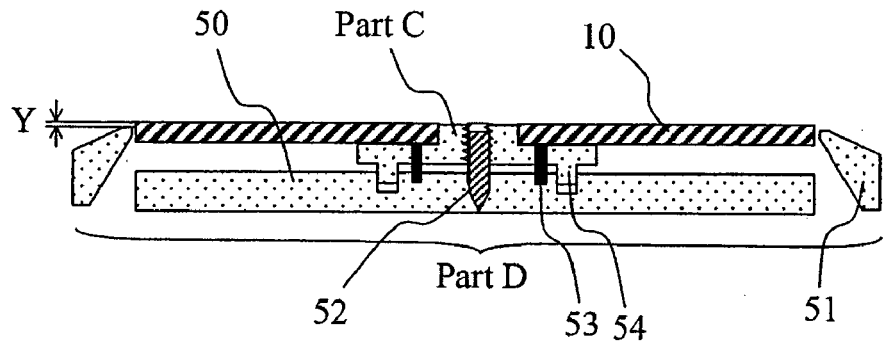
FIG. 5 schematically shows a spin coating apparatus in accordance with another embodiment of the present invention.
Figure 6:
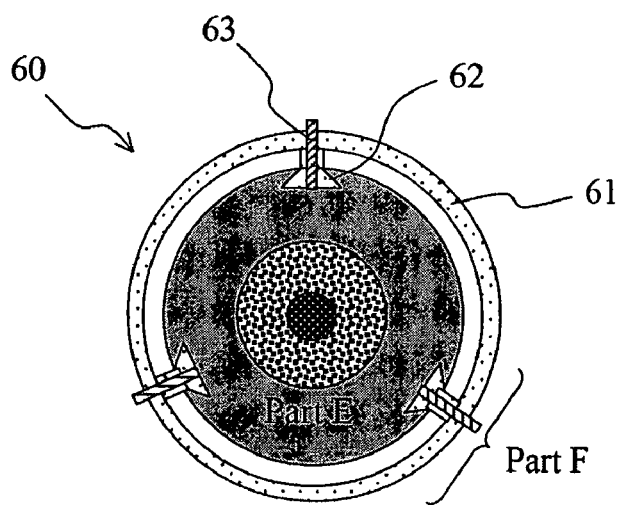
FIG. 6 schematically shows a spin coating apparatus in accordance with a further embodiment of the present invention.

As described above, the spin coating apparatus in accordance with the present invention may further include an apparatus that can adjust the height of the auxiliary member relative to the substrate for coating by dividing the turntable into two parts and moving the auxiliary member upward and downward, in a screw manner (as represented by reference numeral 42 in FIG. 4, and as represented by reference numeral 52 in FIG. 5) or a sliding manner (as represented by 62 in FIG. 6). By adjusting the height of the auxiliary member upward and downward, it is possible to easily control a height deviation, which results from a bending or thickness deviation of the substrate for coating, within the above-mentioned range. Examples of such a structure are shown in FIGS. 4 through 6.

Firstly, referring to FIG. 4, since part A is connected to a spin motor shaft (not shown) and is connected to part B via threads, it is possible to adjust the height of the auxiliary member 41 by rotating part B while fixing part A. After adjustment of heights of the substrate 10 and auxiliary member 41, it is possible to fix parts A and B using a fixing screw 43.

Referring to FIG. 5, part D is connected to a spin motor shaft (not shown) and part C is connected to part D in a manner that a sliding protrusion 54 is fitted into the corresponding groove of part D. As part C is moved upward and downward by a height-adjusting screw 52, it is possible to fix part C on part D via a fixing screw 53 after adjustment of heights of the substrate 10 and auxiliary member 51.

Referring to FIG. 6, as the auxiliary member 61 has a triangle-shaped sliding protrusion 62 which is fitted into a groove of part E, the height between the substrate for coating and auxiliary member 61 can be adjusted by a sliding movement of part F along the groove upward and downward. Further, after adjustment of the height, part F can be fixed to part E via a fixing screw 63.

For example, the heights of the upper ends of the substrate 10 and auxiliary member 51 are preferably positioned at the same heights, or at least the height deviation Y therebetween should be positioned within 0.1 mm. Where the height of the auxiliary member 51 is greater than the above deviation range, i.e., higher than the substrate 10, the inner upper end of the auxiliary member 51 serves as a barrier and thus a coating resin cannot smoothly migrate toward the auxiliary member 51 and the ski-jump may occur. In contrast, where the height of the auxiliary member 51 is less than the above deviation range, the coating resin is applied to significant portions of the sides of the substrate for coating 10 and thereafter migrates to the auxiliary member 51, thus resulting in contamination of the substrate sides, and some of the resin descends due to gravity, thereby filling the space between the substrate for coating 10 and auxiliary member 51, leading to difficulty to remove the substrate for coating 10 after completion of spin coating.

As exemplified above, a turntable, which is capable of adjusting a height in the up and down direction, may have a variety of forms, and details and examples thereof can be found in U.S. Patent Application Publication No. 2005-0039675, the disclosure of which is hereby incorporated by reference.

A person having ordinary skill in the art can easily prepare the spin coating apparatus, based on the structure as discussed above, and for a detailed method of manufacturing such a spin coating apparatus, reference may be made to U.S. Patent Application Publication No. 2005-0039675, the disclosure of which is hereby incorporated by reference.

EXAMPLES

Now, the present invention will be described in more detail with reference to some experimental contents and results, but it should be understood that the scope of the present invention is not limited thereto. Following Examples 1 through 7 and Comparative Examples 1 through 3 illustrate the results when spin coating apparatuses in accordance with the present invention applied to the coating of optical discs.

Example 1

A turntable, as shown in FIG. 4, was manufactured using an aluminum material. A spaced distance between a peripheral part of a substrate for coating and an inner upper end of a ring-shaped auxiliary member was adjusted to 0.5 mm. Meanwhile, a polycarbonate (PC)-based substrate having a total thickness of 1.1 mm, an outer diameter of 120 mm and an inner diameter (diameter of a central hole) of 15 mm was prepared by injection molding, and a four-layer structure of Ag alloy/ZnS—SiO$_2$/SbGeTe/ZnS—SiO$_2$ was formed by a sputtering process, thereby preparing a substrate. The resulting substrate was mounted on the turntable and the ring-shaped auxiliary member was rotated to adjust a height of the upper end thereof to be within a deviation range of 0.05 mm, followed by fixing the height via a fixing screw. Next, EB 8402 (made by SK UCB), Irgacure 184 (made by Ciba SC), Irgacure 651 (made by Ciba SC) and a UV-curable resin including methylethylketone were spin-coated using a spin coating apparatus, thereby forming a cover layer having a thickness of 100 μm. Then, a UV light source was irradiated to cure the UV-curable resin, thereby preparing a coated substrate.

Example 2

A coated substrate was manufactured in the same manner as in Example 1, except that a turntable was manufactured such that a spaced distance between a periphery of a substrate for coating and an inner upper end of an auxiliary member was 0.1 mm.

Example 3

A coated substrate was manufactured in the same manner as in Example 1, except that a PC-based substrate was prepared to have a thickness of 1.2 mm by injection molding.

Example 4

A coated substrate was manufactured in the same manner as in Example 1, except that a PC-based substrate was prepared to have a thickness of 0.6 mm by injection molding.

Example 5

A coated substrate was manufactured in the same manner as in Example 1, except that a cover layer was formed to have a thickness of 25 μm.

Example 6

A coated substrate was manufactured in the same manner as in Example 1, except that a turntable was manufactured as shown in FIG. 5.

Example 7

A coated substrate was manufactured in the same manner as in Example 1, except that a turntable was manufactured as shown in FIG. 6.

Comparative Example 1

A coated substrate was manufactured in the same manner as in Example 1, except that a turntable was manufactured such that a spaced distance between a periphery of a substrate for coating and an inner upper end of an auxiliary member was 0.01 mm.

Comparative Example 2

A coated substrate was manufactured in the same manner as in Example 1, except that a turntable was manufactured such that a spaced distance between a periphery of a substrate for coating and an inner upper end of an auxiliary member was 1.0 mm.

Comparative Example 3

A coated substrate was manufactured in the same manner as in Example 1, except that an upper end of an ring-shaped auxiliary member was adjusted to be 0.12 mm higher than a turntable.

Comparative Example 4

A coated substrate was manufactured in the same manner as in Example 1, except that an upper end of an ring-shaped auxiliary member was adjusted to be 0.12 mm lower than a turntable.

Comparative Example 5

A coated substrate was manufactured in the same manner as in Example 1, except that a turntable was manufactured as shown in FIG. 4, but in the form of a stationary and integral turntable such that the height of the upper portion of a ring-shaped member was optimized when a 1.1 mm thick-substrate having a tilt of less than 0.3 degrees relative to the radial direction was mounted, a PC-based substrate having a thickness of 0.6 mm was injection molded as a substrate for coating, and a tilt relative to the radial direction is 0.7 degrees.

Experimental Example 1

An average thickness and standard deviation of entire regions of coated substrates manufactured in Examples 1 through 7, except for ski-jump regions at end portions thereof, and the maximum thickness at ski-jump regions of end portions of coated substrates were measured. The results are shown in Table 1 below.

TABLE 1

|  | Avg. thick. | SD | Max. thick. of ski-jump region |
| --- | --- | --- | --- |
| Ex. 1 | 99.5 μm | ±0.7 μm | 102.7 μm |
| Ex. 2 | 100.2 μm | ±0.6 μm | 104.2 μm |
| Ex. 3 | 98.9 μm | ±0.6 μm | 101.4 μm |
| Ex. 4 | 101.0 μm | ±0.5 μm | 105.1 μm |
| Ex. 5 | 25 μm | ±0.3 μm | 26.1 μm |
| Ex. 6 | 99.5 μm | ±0.8 μm | 101.6 μm |
| Ex. 7 | 99.9 μm | ±0.7 μm | 106.3 μm |

Experimental Example 2

An average thickness and standard deviation of entire regions of coated substrates manufactured in Comparative Examples 1 through 5, except for ski-jump regions at end portions thereof, and the maximum thickness at ski-jump regions of end portions of coated substrates were measured. The results are shown in Table 2 below.

TABLE 2

|  | Avg. thick. | SD | Max. thick. of ski-jump region |
| --- | --- | --- | --- |
| Comp. Ex. 1 | 98.7 μm | ±0.9 μm | 116.2 μm |
| Comp. Ex. 2 | 99.2 μm | ±0.8 μm | 149.4 μm |

TABLE 2-continued

|  | Avg. thick. | SD | Max. thick. of ski-jump region |
|---|---|---|---|
| Comp. Ex. 3 | 97.2 μm | ±0.8 μm | 126.4 μm |
| Comp. Ex. 4 | 98.0 μm | ±0.9 μm | 109.4 μm |
| Comp. Ex. 5 | 100.1 μm | ±1.0 μm | 128.9 μm |

As can be seen from Tables 1 and 2, Examples 1 through 7 in accordance with the present invention exhibited formation of ski-jump having a small size, as compared to Comparative Examples 1 through 3 and 5. Although Comparative Example 4 also exhibited formation of a small ski-jump, it was confirmed that the cured resin on some portion of a periphery of the substrate was separated off during a removal process of a polycarbonate substrate as a substrate for coating from the ring-shaped auxiliary member.

INDUSTRIAL APPLICABILITY

As apparent from the foregoing, a spin coating apparatus in accordance with the present invention eliminates or effectively reduces a ski-jump phenomenon at end portions of a coated substrate occurring when spin coating is performed, regardless of changes in a thickness or tilt of a substrate for coating, thereby resulting in uniform coating of a coating solution on the substrate, and also effectively decreases contamination of the substrate for coating due to inflow or stay of the remaining coating agent.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A spin coating apparatus comprising a ring-shaped or polygonal auxiliary member wherein the ring-shaped or polygonal auxiliary member is installed adjacent to the side of a substrate for coating, upon mounting the substrate on a turntable, a spaced distance between the inner upper end of the ring-shaped or polygonal auxiliary member and the periphery of the substrate is within a range of 0.03 to 0.8 mm, and heights of the upper ends of the ring-shaped or polygonal auxiliary member and substrate are identical to each other or are positioned within a deviation range of less than 0.1 mm such that a coating resin can migrate toward the ring-shaped or polygonal auxiliary member, wherein the spin coating apparatus includes a stationary part and a moving part, and the moving part has a height-adjustable structure such that the moving part is movable upward and downward relative to the stationary part, wherein the coating resin is dropped on a central portion of the substrate for coating while the spin coating apparatus is rotating at a low speed, and the coating resin spreads outward from the center portion of the substrate due to a centrifugal force and is applied to the entire substrate while the spin coating apparatus is rotating at a high speed.

2. The spin coating apparatus according to claim 1, wherein the spaced distance is within a range of 0.1 to 0.6 mm.

3. The spin coating apparatus according to claim 1, wherein the height-adjustable structure has a structure in which threads are formed in a coupling region between the moving part and stationary part, and the height of the ring-shaped or polygonal auxiliary member is adjusted by rotating the moving part.

4. The spin coating apparatus according to claim 1, wherein the height-adjustable structure has a structure in which the moving part and stationary part are coupled to each other via a height-adjusting screw, and the height of the ring-shaped or polygonal auxiliary member is adjusted by rotating the screw.

5. The spin coating apparatus according to claim 1, wherein the height-adjustable structure has a structure in which male and female fastening members are included in a coupling region between the moving part and stationary part, and the height of the ring-shaped or polygonal auxiliary member is adjusted by inserting or releasing the male fastening member into or from the female fastening member.

6. The spin coating apparatus according to any one of claim 1, wherein a fixing screw is further included in a coupling region between the moving part and stationary part, in order to achieve a stable coupling between the moving part and stationary part under the condition that the height was adjusted.

7. A coated substrate prepared using the spin coating apparatus of claim 1, wherein a thickness deviation at the data-recording area except for the ski jump region is within ±2%, and a ski jump at the periphery thereof is within 10%.

8. The coated substrate according to claim 7, wherein the coated substrate is an optical disc including a substrate and a cover layer.

9. The coated substrate according to claim 7, wherein the coated substrate is a semiconductor wafer.

10. A coated substrate according to claim 7, wherein the coated substrate is an ultrasonic endoscopic piezoelectric ceramic plate.

* * * * *